United States Patent [19]
Perfecto et al.

[11] Patent Number: 5,464,682
[45] Date of Patent: Nov. 7, 1995

[54] MINIMAL CAPTURE PADS APPLIED TO CERAMIC VIAS IN CERAMIC SUBSTRATES

[75] Inventors: Eric D. Perfecto; Chandrika Prasad, both of Wappingers Falls; Keshav Prasad, Poughkeepsie; Gordon J. Robbins, Wappingers Falls; Madhavan Swaminathan, Wappingers Falls; George E. White, Fishkill, all of N.Y.

[73] Assignee: International Business Machines Corporation, Armonk, N.Y.

[21] Appl. No.: 166,424

[22] Filed: Dec. 14, 1993

[51] Int. Cl.⁶ ........................................... B32B 9/00
[52] U.S. Cl. .................... 428/210; 428/901; 361/767; 361/777; 174/261; 228/180.21; 439/68; 439/83
[58] Field of Search ................... 428/210, 901; 361/767, 777; 174/261; 228/180.21; 439/68, 83

[56] References Cited

U.S. PATENT DOCUMENTS

| | | | |
|---|---|---|---|
| 4,677,630 | 6/1987 | Mamiya et al. | 361/414 |
| 4,791,075 | 12/1988 | Lin | 437/209 |
| 4,926,241 | 5/1990 | Carey | 357/74 |
| 5,081,563 | 1/1992 | Feng et al. | 361/414 |
| 5,315,485 | 5/1994 | Magill et al. | 361/767 |

OTHER PUBLICATIONS

Dougherty, W. E. "Misregistration Compensation in Multi-layer Structures", IBM Technical Disclosure Bulletin, vol. 22, No. 12, May 1980.
Athawes, W. H., Bucek, A., "MC Substrate Chrome Artwork Mask" IBM Technical Disclosure Bulletin, vol. 24, No. 3, Aug. 1981.

*Primary Examiner*—Patrick J. Ryan
*Assistant Examiner*—Kam F. Lee
*Attorney, Agent, or Firm*—Perman & Green

[57] ABSTRACT

A device includes a ceramic substrate. A ceramic via is defined within the ceramic substrate at an actual location which differs from a designed desired location for the ceramic via. A minimal capture pad electrically communicates the actual location with the designed desired location. The minimal capture pad contains a ceramic via contact portion, a thin film stud contact portion, and a connecting portion; and each of the three is configured to be as small as permitted to limit the capacitances produced by the capture pad.

15 Claims, 4 Drawing Sheets

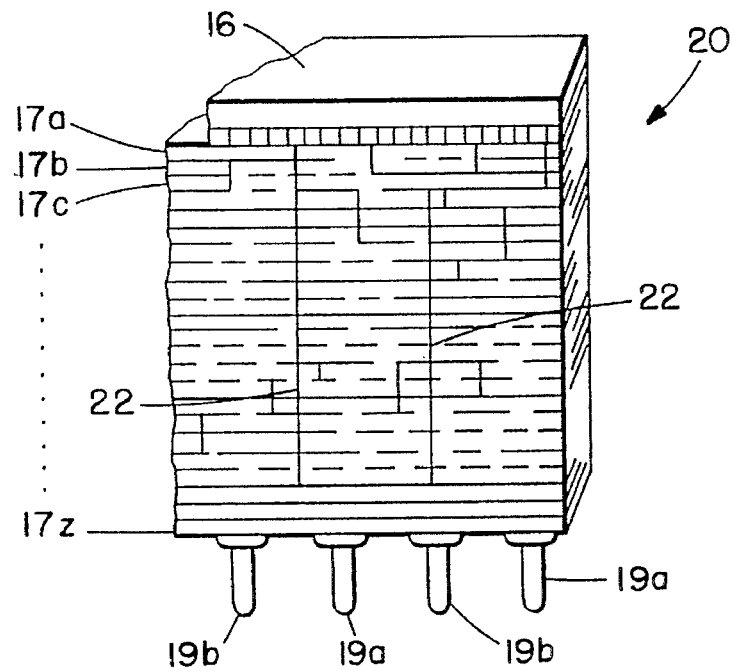
FIG. 1.
PRIOR ART
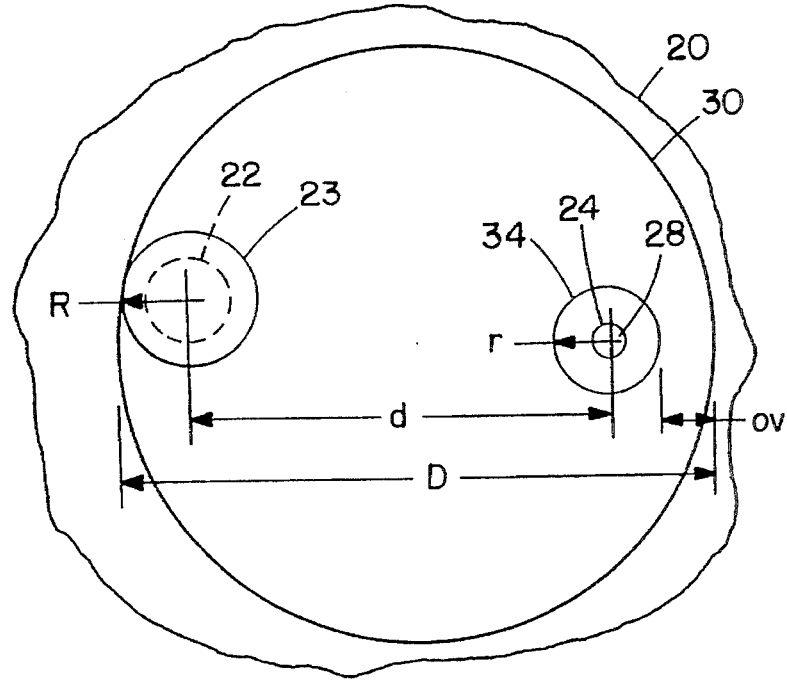
FIG. 2.
PRIOR ART
FIG. 3.
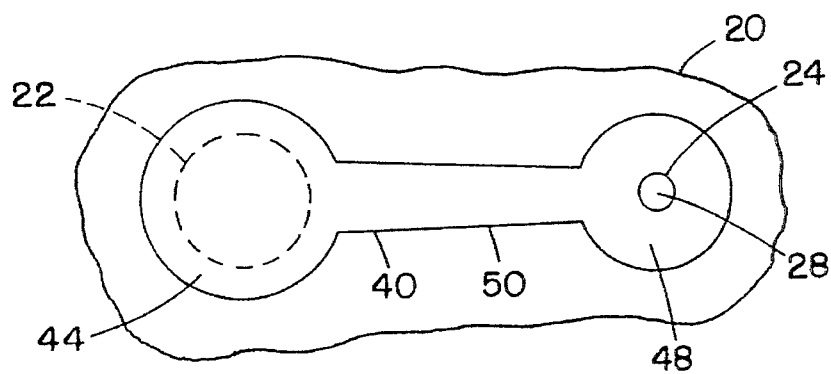

5,464,682

MINIMAL CAPTURE PADS APPLIED TO CERAMIC VIAS IN CERAMIC SUBSTRATES

FIELD OF INVENTION

The present invention relates to the application of capture pads to misaligned ceramic vias and, more particularly, to capture pads which are configured to have smaller dimensions than the prior art capture pads, thereby reducing capacitive losses and response times.

BACKGROUND OF THE INVENTION

A ceramic via may be considered as an electrical conduit extending between multiple conductive layers contained within a ceramic substrate. It is important for proper ceramic via operation that a thin film stud which is in electrical connection with that ceramic via shall be precisely aligned relative to the ceramic substrate. Distortion of the ceramic substrate, however, typically occurs during the sintering phase of manufacturing, with the amount of distortion varying between ceramic substrates which are customarily produced in large numbers. This variable distortion causes the actual location of the ceramic via to be different from (offset about) the nominal design desired location for both the ceramic via and the thin film stud. The thin film stud is typically mounted at the design desired location.

Previously, to accommodate the above distortions, large capture (i.e., electrical contact) pads have been applied between each misaligned ceramic via and its associated thin film stud in order to provide the required electrical connection. The standardized capture pads therefore had to be sized large enough to encompass the largest potential displacement offset between the actual and the design desired location, for all of the ceramic vias in a given ceramic substrate, regardless of their individual displacements. The situation is further aggravated when multiple ceramic substrates are used because the capture pad now has to be sized large enough to provide electrical connection for the worst individual displacement in any one of the ceramic substrates.

The large capture Dads become charged during operation of the associated electronic circuits and, in themselves, have the collective capability of producing high electrical capacitances. As the performance of the electronic circuits increases, and they become more densely packed and contain more electronic components (including ceramic vias), the overall effect of the capacitances so produced is to slow down the operation of, and possibly produce spurious or erroneous signals within, the electronic circuit.

It is evident that it would therefore be desirable to reduce the size of the capture pads associated with the ceramic vias of ceramic substrates. This would result in faster, more reliable, and more energy efficient responses within the overall electronic circuit. It would also reduce the valuable electronic circuit space required by the capture pad itself.

SUMMARY OF THE INVENTION

The present invention relates to a device which includes a ceramic substrate. A ceramic via is defined within the ceramic substrate at an actual location which differs from a design desired location for the ceramic via. A minimal capture pad electrically connects the actual location with the design desired location.

BRIEF DESCRIPTION OF THE DRAWING FIGURES

FIG. 1 illustrates a partial perspective cross sectional view of a prior art configuration illustrating a ceramic substrate and integrated circuit chip configuration and with ceramic vias interspaced within the substrate;

FIG. 2 illustrates a plan view of a portion of a ceramic substrate including a prior art large capture pad which provides an electrical connection between a ceramic via and a thin film stud;

FIG. 3 illustrates a plan view of one embodiment of the present invention including a minimal capture pad which provides an electrical connection between a ceramic via and a thin film stud;

Figure 4:
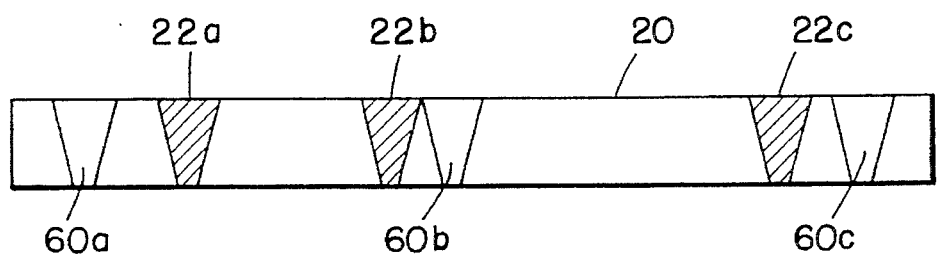
Figure 5:
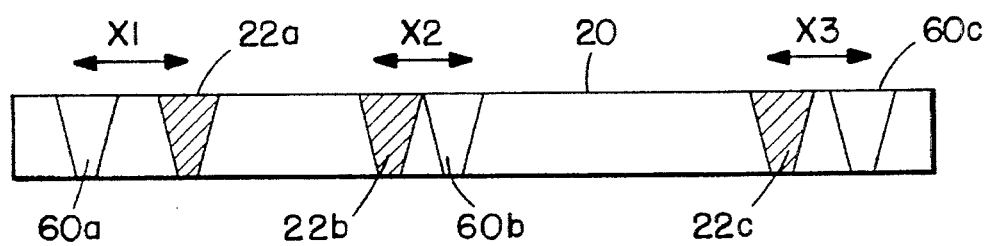
Figure 6:
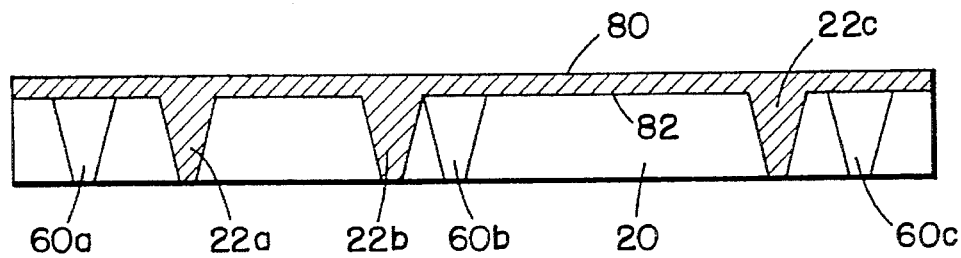
Figure 7:
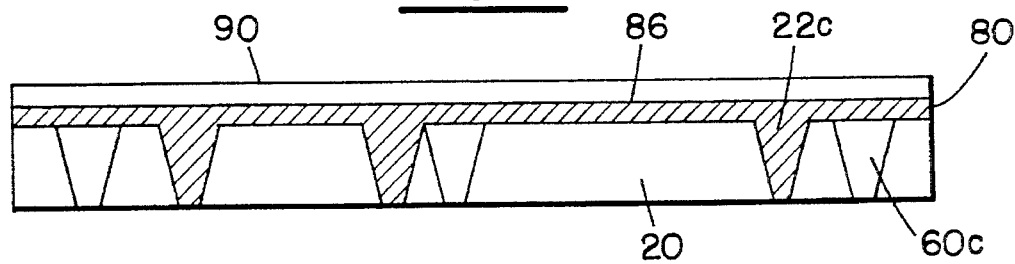
Figure 8:
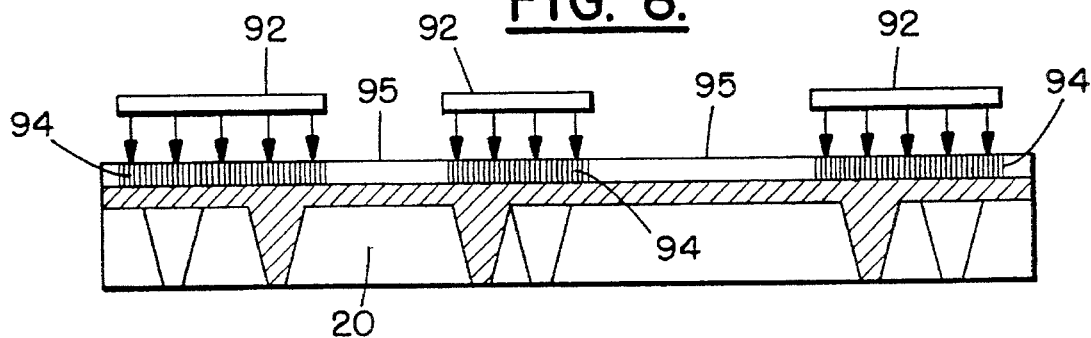
Figure 9:
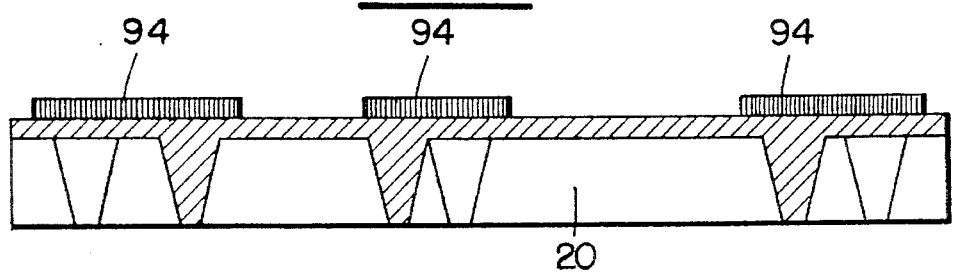
Figure 10:
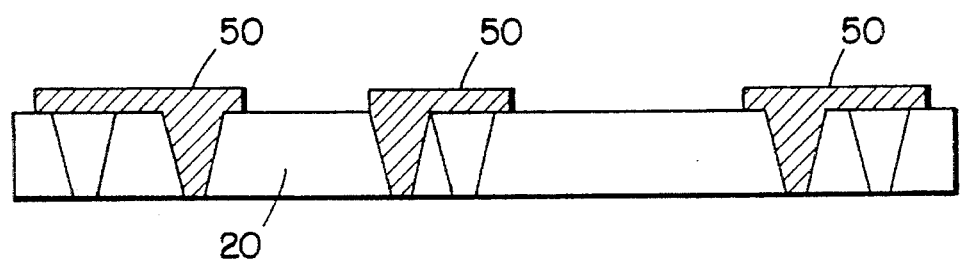
Figure 11:
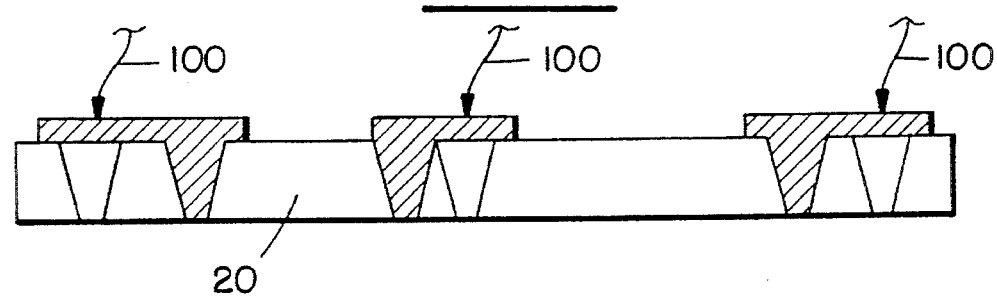
Figure 12:
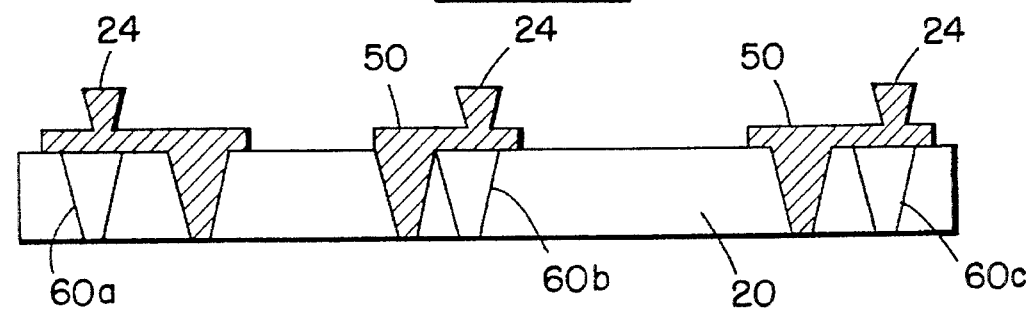
Figure 13:
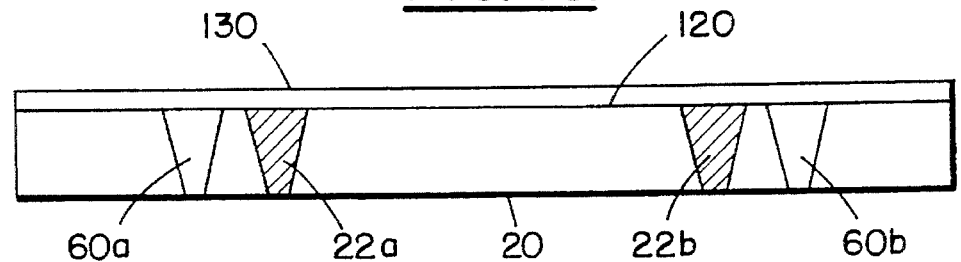
Figure 14:
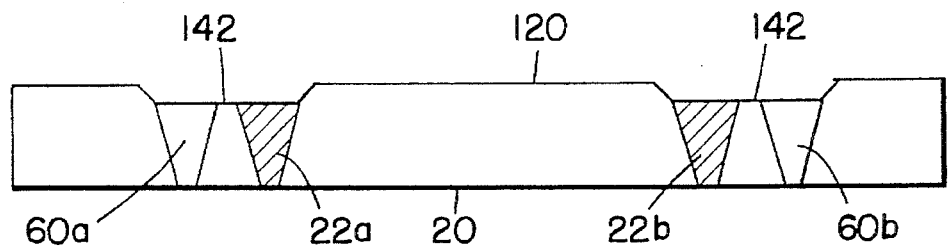
Figure 15:
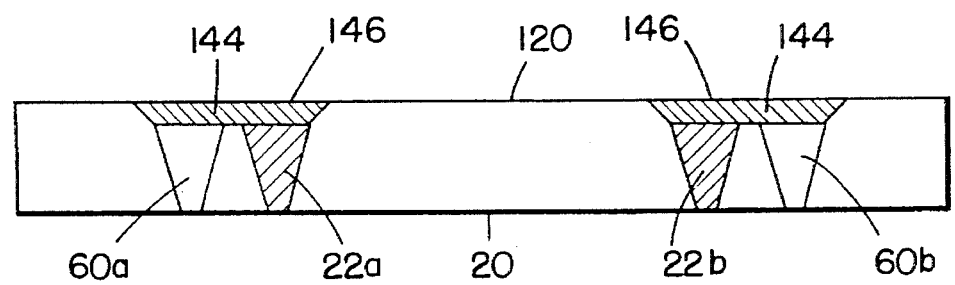
Figure 16:
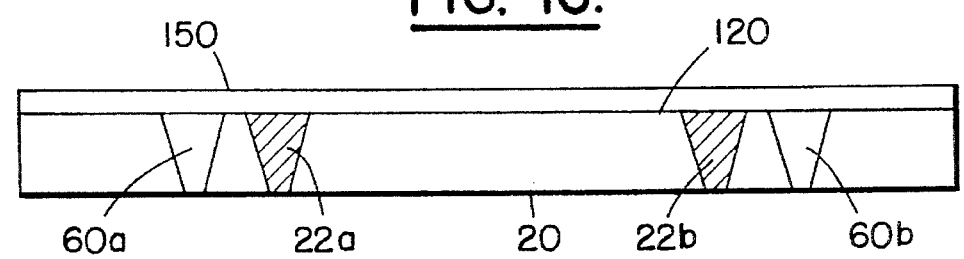
Figure 17:
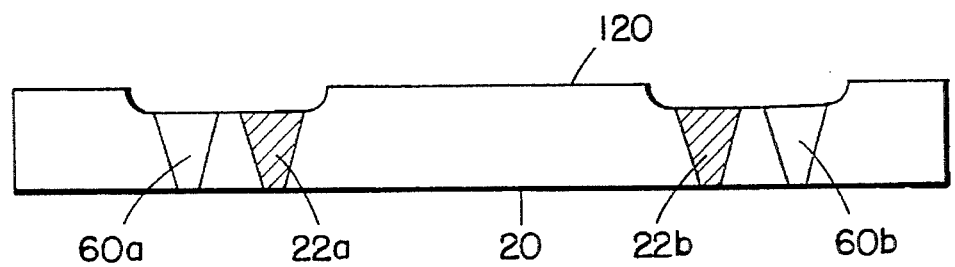
Figure 18:
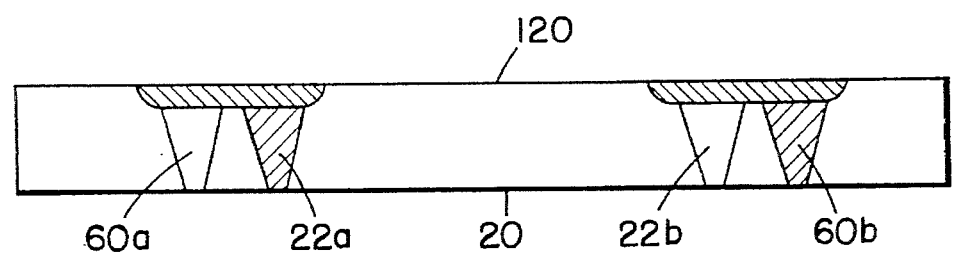

FIG. 4 illustrates a side cross sectional view of a portion of ceramic substrate 20 with ceramic vias 22a, 22b, 22c displaced from the design desired locations 60a, 60b, 60c, which FIGS. 4 to 12 illustrate one embodiment of a method for producing a minimal capture pad of the present invention;

FIG. 5 illustrates the ceramic substrate 20 of FIG. 4, with mapping completed which indicates the distance between an actual ceramic via location and the design desired ceramic via location;

FIG. 6 illustrates the ceramic substrate of FIG. 5 with a sputter seed layer deposited on the ceramic substrate;

FIG. 7 illustrates the ceramic substrate with the sputter seed layer of FIG. 6 and a photoresist layer coated on top of said sputter seed layer;

FIG. 8 illustrates the ceramic substrate of FIG. 7 which have certain portion of the photoresist layer hardened by such methods as laser direct writing or e-beam exposure (typically utilizing masks to define those portions which are hardened);

FIG. 9 illustrates the ceramic substrate of FIG. 8 with the hardened photoresist developed;

FIG. 10 illustrates the ceramic substrate of FIG. 9, with the desired locations of the sputter seed layer etched away, and the photoresist layer removed;

FIG. 11 illustrates the ceramic substrate of FIG. 10, which is placed in a position for electric testing;

FIG. 12 illustrates the ceramic substrate of FIG. 11, in which thin film studs are applied;

FIGS. 13–15 illustrates a portion of a ceramic substrate undergoing another method to produce minimal capture pads in another embodiment of the present invention; and FIGS. 16–18 illustrate a portion of a ceramic substrate undergoing yet another method to produce minimal capture pads in yet another embodiment of the present invention.

DETAILED DESCRIPTION OF THE PRESENT INVENTION

In this disclosure, identical reference characters may be assigned to those elements which perform identical functions in different embodiments. The specific configurations, materials, and dimensions illustrated in this disclosure are intended to be illustrative, and not limiting in scope.

CAPTURE PAD CONFIGURATIONS

FIG. 1 illustrates a prior art ceramic substrate 20 having integrated circuit chip 16 associated therewith. Such ceramic substrates 20 are considered as packaging for the integrated circuit chips 16. The primary functions of the ceramic substrate 20 are to act as a support for, to maintain the temperature of, and to provide electricity to, the integrated circuit chip 16. The ceramic substrates 20 are typically formed from a plurality of ceramic layers 17a, 17b, 17c . . . 17z, which are interplaced one on top of another in a generally known manner. Certain of the layers are configured with conductive patterns as a function of the overall design of the system. A plurality of ceramic vias 22 (which may be considered as electrical conduits extending through the ceramic substrate) connect one or more ceramic layers 17a, 17b, 17c . . . 17z to at least one signal pin 19a and at least one ground pin 19b. These ceramic vias are typically arranged perpendicular to the ceramic layers in a grid array to provide sufficient electrical sources for the entire ceramic substrate 20. Due to wiring density limitations in the ceramic substrate, thin film layers are added between the chip and ceramic substrate. The thin film layers provide for a high wiring density.

The ceramic vias 22 may be formed by a number of techniques, that essentially involve producing recesses within the ceramic substrate 20 which are then back-filled or coated with conductive material. Techniques for producing the recesses that encompass the ceramic vias include punching of green ceramic, laser drilling, photomachining, and crystallographic etching. After the recess is formed, conductive materials are inserted into the recess to form the ceramic vias with typical materials being copper, tungsten, molybdenum, gold and nickel. The choice of appropriate material(s) is largely based upon the adhesion characteristics between that material and the remainder of the ceramic substrate 20.

FIG. 2 illustrates a plan view of a prior art ceramic substrate 20 which contains a ceramic via 22. Ideally, the location of ceramic via 22 should be aligned with its associated thin film stud 24. Accurate placement of the electronic thin film stud 24 at a design desired location 28 is required in order that proper electrical connection occur between the thin film stud 24 and the remainder of the electronic circuit. However, there is a tendency for the material of the ceramic substrate 20 and/or the ceramic via 22 to shrink or distort, particularly during the sintering phase of manufacturing. It is therefore very difficult to precisely locate a ceramic via 22 relative to the ceramic substrate 20 or the thin film stud 24 precisely at the design desired location 28. The ceramic substrate 20 is typically rigidly positioned within an integral component. Electrical connections between the two technologies is provided by means of thin film studs 24 placed close to ceramic vias 22.

In the prior art ceramic substrate shown in FIG. 2, the electrical connection between the ceramic via 22 and the thin film stud 24 has been provided by the large capture pad 30. For proper electrical conductivity, a diameter D of the large capture pad 30 must exceed a maximum potential distance d between the ceramic via 22 and the thin film stud 24, plus a radius R of a required contact 23 for the ceramic via 22 plus a radius r of the required contact 34 for the thin film stud 24. There are often many ceramic vias 22 on each ceramic substrate 20, and it is impractical for prior art methods to use large capture pads 30 of differing sizes. It is therefore required that the above calculation method for deriving the diameter D of the large capture pad 30 account for the maximum potential offset for any single ceramic via 22 in the entire ceramic substrate 20. Therefore, the large capture pads 30 are typically larger than necessary to provide electrical connection between most of the ceramic vias 22 and their thin film studs 24. An overlap OV demonstrates such an excessive sizing.

There are two main problems with using large capture pads 30. First, the capture pad will limit ceramic via spacing which is undesirable as electronic circuits become more powerful and densely packed. Second, the large capture pads 30 can generate significant and unwanted capacitances when they have sufficient electrical charge. These significant capacitances will tend to slow down the response time of signals passing through the capture pad 30 to or from the ceramic via 22 and can also result in inaccurate signal generation. Therefore, one of the primary concerns of the present invention is to limit generation of such capacitances within the capture pads.

FIG. 3 illustrates a plan view of one embodiment of the present invention. The actual location and the design desired location of the ceramic via 22 are both located at the same relative position on the ceramic substrate 20 as in the FIG. 2 embodiment. The FIG. 3 embodiment illustrates a minimal capture pad 40 which replaces the FIG. 2 prior art large capture pad 30. The minimal capture pad 40 comprises a ceramic via contact portion 44; a thin film stud contact portion 48; and, if necessary, a connector portion 50. The connector portion 50 is only necessary when the ceramic via contact portion 44 and the thin film stud contact portion 48 are positioned sufficiently far apart to prevent adequate electrical connection therebetween.

The ceramic via contact portion 44 is configured and sized to provide an adequate electrical contact between the ceramic via 22 and the capture pad 40, considering design choices, wiring rules and requirements. The thin film stud contact portion 48 is configured and sized to provide for an adequate electrical contact between the thin film stud 24 and the minimal capture pad 40. The connector portion is configured and sized to provide for adequate current transmission between the ceramic via contact portion 44 and the thin film contact portion 48. In this disclosure, the term "minimal capture pad" is defined as a capture pad which is configured and sized to have relatively small electrical capacitances in that it is specifically sized for the distance d between each ceramic via 22 and thin film stud 24. The dimensions of all portions of the minimal capture pad 40 are selected according to design choices and requirements considering the amount of current which the contact pad is likely to encounter.

The minimal capture pad 40 of FIG. 3 is much smaller than the large capture pad 30 of FIG. 2. This size reduction provides for a reduction in both space in the ceramic substrate 20 covered by the capture pad, and electrical capacitance typically produced by the capture pad. Both of the reductions are cumulative in multi-component systems so that the advantages of the minimal capture pads 40 are highly desirable, especially in larger ceramic substrates associated with complex electronic systems.

Method Of Manufacture For Capture Pads

One method of forming the minimal capture pad 40 of the present invention is illustrated in FIGS. 4 to 12. FIG. 4 illustrates a two dimensional cross sectional view of a portion of the ceramic substrate 20 containing a plurality of ceramic vias 22a, 22b, 22c in their actual locations. The design desired location of the ceramic vias 22a, 22b, 22c are illustrated as 60a, 60b, and 60c, respectively.

The ceramic substrate is first mapped to determine the actual location of each of the ceramic vias 22a, 22b, 22c, typically utilizing some photodetector equipment. The design desired location of the ceramic vias has been previously stored in memory in relation to some physical aspect of the substrate. The actual location of the ceramic vias 22a, 22b, 22c is then input into a processor which compares the actual locations to the design desired locations 60a, 60b, 60c to obtain a set of offset distortions X1, X2 and X3, respectively, as illustrated in FIG. 5. While the offsets X1, X2 and X3 are illustrated in one dimension only, it is likely that there will be similar offsets along the axis normal to the paper. This mapping occurs simultaneously within the two dimensions.

The mapping technique of the present invention involving the minimal capture pads 40 differs significantly from the prior art large capture pads 30. Mapping of the large prior art capture pads requires knowledge of the greatest distance that could potentially exist between the actual and the design desired location for any ceramic via. Precise positioning of the large capture pads 30 is therefore usually not necessary. Each large capture pad is therefore positioned to capture the maximum potential offset with a knowledge of the offsets other ceramic vias in the region have undergone.

By comparison, when the minimal capture pads 40 of the present invention are used, the precise actual and design desired location 60a, 60b, 60c of each ceramic via must be mapped individually. Otherwise, the ceramic via contact portion 44 will not be properly aligned with the ceramic via 22 and/or the thin film stud contact portion 48 will not be aligned with the thin film stud 24. Also, it is essential that the specific size of the ceramic via be accurately determined so that the ceramic via contact portion will neither be oversized or undersized which, in turn, would produce an excessive capacitance or insufficient electric contact respectively.

The individual mapping of each ceramic via 22 can be performed using an ATFIS 2D imaging tool using a photo detector imaging tool which has the capability of mapping an individual ceramic via and recording it's exact position. The positional data is then downloaded into a second program, thereby indicating the offset between actual and design desired location for each ceramic via 22 and thin film stud 24. This permits the position of the ceramic via contact portion 44 and the thin film stud contact portion 48 to be accurately determined by applying the appropriate rules and principles. In a similar manner, the size of the contact portions 44, 48 can also be determined. If the ceramic via contact portion 44 and the thin film stud contact portion 48 are not close enough to generate sufficient electrical contact an algorithm can be used to determine an optimum connecting portion 50, for example a conductive conduit 50 microns wide. The total data obtained thus far (which comprises the ceramic via contact portion 44 location and size, the thin film stud contact portion 48 location and size, and the size and orientation of the connector portion 50) will then be fed into the input of a direct expose tool (not illustrated) for use as described below.

FIG. 6 illustrates a portion of the ceramic substrate 20 of FIG. 5 with a sputter seed layer 80 deposited on the upper surface 82 of the ceramic substrate 20. The sputter seed layer 80 is conductive material from which the minimal capture pad 40 will ultimately be formed. Two microns of copper sputter being applied to the upper surface 82 of the ceramic substrate 20 is typical.

FIG. 7 illustrates a photoresist layer 90 having been deposited on the outer surface of the sputter seed layer 80 shown in FIG. 6. The photoresist layer may be any type of commonly known positive or negative tone photoresist. Positive photoresists will develop in locations that have been exposed to ultraviolet or laser radiation, and negative photoresist will develop in locations where ultraviolet or laser radiation has not been applied. It is assumed that positive photoresist is used in the present application. The processing of both positive and negative photoresist types involve the application of masks to obtain selective removal in a well known manner. The photoresist layer is applied to all of the sputter seed layer 80 (which can be Cr/copper or metal), and both layers must at least cover those portions of the upper surface 82 where the minimal capture pad 40 will be defined.

FIG. 8 illustrates the process for defining the photoresist layer 90 above those areas of sputter seed layer 80 that will become capture pads on the ceramic substrate 20 of FIG. 7. This may be done by techniques involving a conventional expose tool 92 or a laser direct write tool (not shown), both in combination with appropriate masks. In forming large prior art capture pads 30, the conventional expose tool 92 is used to expose large, substantially cylindrical, portions of the photoresist layer 90. Where minimal capture pads 40 of the present invention type illustrated in FIG. 3 are being produced, it is essential to be able to precisely define their individual outline and location. The remainder of this method will assume that the laser direct write tool was used to expose the photoresist.

FIG. 9 illustrates a portion of the ceramic substrate 20 in which exposed portions 94 of the photoresist 90 (of FIG. 8) remain; while the unexposed portions 95 of the photoresist are developed away using known processes. The sputter seed layer 80 portion located below the hardened portions of the photoresist 94 define the minimal capture pads 40. This is commonly referred to as subtractive etching.

FIG. 10 illustrates a portion of the ceramic substrate 20 of FIG. 9 in which the conductive sputter seed layer formerly under the unexposed portions 95 of the photoresist have now been removed, such as by known etching techniques. As a subsequent processing step, the exposed portions 94 of photoresist are stripped, leaving the minimal capture pads 40.

FIG. 11 illustrates a portion of the ceramic substrate of FIG. 10 which is undergoing electrical testing using probes 100. If the FIG. 11 ceramic substrate passes all of the electrical tests, then the probes 100 are then removed. The thin film studs 24 are then mounted to encompass the design desired location of the ceramic vias 60a, 60b and 60c as illustrated in FIG. 12 which represents the final product produced by the process outlined in FIGS. 4–12.

Capacitances Generated Within the Capture Pads

The following section illustrates the significance that capture pad size can have on unwanted capacitance which, in turn, effects the performance of the overall electronic circuit. Similarly, it demonstrates that this effect can become relatively insignificant if minimal capture pad technology is adopted.

In ceramic substrates with thin films, there have been potential sources detected where ceramic vias produce capacitance in ceramic substrates. These include:

1. From the C4 (controlled collapse chip connection) to the last plane of the thin film.
2. From the last wiring plane of the thin film to the first wiring plane of the ceramic in the substrate 20.
3. From each ceramic layer which is metallized.
4. From the metallized lowest ceramic layer to the bottom surface of the substrate.

In a high performance design, all of the critical nets that determine the cycle time of an electronic device utilizing the integrated circuit chip 16 are either in the thin film or in the first few ceramic layers 17 of the ceramic substrate. Of the total nets for a module, most of the nets are in the ceramic layers due to the maximum net length restrictions for the thin film layer.

Most of the capacitance of present (large) capture pad technology is produced with the ceramic substrate (approximately 95%) as opposed to that produced with the thin film ( approximately 5% ). Of this, the major contributor is the large capture pads. The use of the minimal capture pad technology removal space of the present invention would therefore permit a large improvement in performance by reducing unwanted capacitance.

Calculations on Similar Configurations

Table 1 compares the capacitance generated by large capture pads 30 and minimal capture pads 40, as determined by analytical methods.

TABLE 1

Capacitances in Different Capture Pads

| Technology | Capture Pad | Total Capac. | % Capture Pad |
|---|---|---|---|
| Large C.P. (Nom.) | 0.35 pF | 0.602 pF | 58% |
| Large C.P. (Worst) | 0.41 pF | 0.89 pF | 46% |
| Minimal C.P. (Nom.) | 0.045 pF | 0.297 pF | 15% |
| Min. C.P. (Worst) | 0.12 pF | 0.6 pF | 20% |

From this data, it can be seen that total capacitance can be reduced by using minimal contact pad design technology and, when done, that the influence of capacitance produced by the capture pads becomes insignificant. Furthermore, the data in Table 2 shows the substantial reduction in capacitance attributable to using the minimal capture pad technology, especially in the best case scenarios.

TABLE 2

Capacitances Generated By Capture Pads

| Case | Large Capture Pads | Minimal Capture Pads | Reduction |
|---|---|---|---|
| Best | 0.29 pF | 0.018 pF | 16X |
| Nominal | 0.35 pF | 0.045 pF | 8X |
| Worst | 0.41 pF | 0.12 pF | 3.5X |

The use of larger capture pads is equivalent, in effect, to adding more ceramic layers 17 to the ceramic substrate 20. Table 3 illustrates the equivalent layers of metallized ceramic layers 17 required to produce the equivalent capacitance generated by various capture pad technologies. Since additional layers add capacitance, a net slowdown results from the additional layers.

TABLE 3

Ceramic Layer Capacitive Equivalence

| | Number of Equivalent Ceramic Layers | |
|---|---|---|
| Technology | Nominal | Worst Case |
| Large Capture Pad | 6 | 7 |
| Minimal Capture Pad | 0.8 | 2 |

Unwanted capacitance can influence the performance of the overall circuit by causing electronic delays and reflected noise. If these delays and reflected noises could be reduced, it would provide a simultaneous beneficial effect upon the wiring rules. The use of minimal capture pad technology permits the possibility of further reducing the level of ceramic capacitance, electronic delay, and the reflected noise.

For example, consider the instance where a critical address in the uppermost metallized ceramic layer 17a which is driving multiple C4s (in multi drop nets). The ceramic via capacitance from each C4 to the uppermost metallized ceramic layer 17a will produce reflected noise and delay as shown in Table 4.

TABLE 4

Nominal Reflective and Delay Values for Capture Pads

| | Ceramic via Cap. from C4 to X1 | Reflected Voltage (Noise)per ceramic via in mV | Delay in ps |
|---|---|---|---|
| Large CP | 0.674 pF | approx. 80 | approx. 20 |
| Minimal CP | 0.369 pF | approx. 40 | approx. 10 |

In Table 4, both the reflected voltage (noise) and the delay are reduced by approximately 50 percent when minimal capture pads are used. These values assume some typical wiring rule numbers (Vin=850 mV–for bipolar technology). The noise currently allowed for ceramic networks is approximately 10% of Vin which is 85 mV. Since the reflected voltage acts as noise, the capacitance of the ceramic via has accounted for most noise permitted for accurate signal transmission, and any slight signal aberration would result in false receiver switching. This is especially true for networks connected in a daisy chain configuration. Minimal capture pad technology however reduces the reflected voltage by half therefore reducing the possibility of false signal transitions. The capacitance of the prior art large ceramic vias adds an electronic delay of 20 pSec (which is twice that of the minimal contact ceramic via technology) per ceramic via. This could also be significant for networks where multiple ceramic vias are arranged in series.

In conclusion, large prior art capture pads may add considerable unwanted capacitance to, and can also seriously affect the wiring rules and performance of, a circuit containing ceramic vias. Use of minimal capture pads reduces the capacitance, noise and delay to a point where they are no longer a major design consideration involved in performance of electronic circuits containing ceramic substrates 20.

Alternate Fabrication Methods For Minimal Capture Pads

FIGS. 4 to 12 illustrate one method to produce minimal capture pads of the present invention as illustrated in FIG. 3. Any method which results in a similar configuration to the minimal capture pads 40 as illustrated in FIG. 3 is within the scope of the present invention.

For instance, the minimal capture pads 40 in FIG. 12 are raised above the level of an upper surface 120 of the substrate 20. There may be certain design considerations which require that an upper surface of the minimal capture pad 40 be located at or below the upper surface 120 of the ceramic substrate 20, configuration will be referred to herein as embedded minimal capture pads. Two methods of achieving this result are described as examples.

The first embodiment which achieves embedded minimal capture pads, which involves many of the identical processes as illustrated in the FIGS. 3–12 embodiment, is illustrated in FIGS. 13–15 and involves a layer of photosensitive polymer 130 being applied to an upper surface 120 of the substrate 20. The capture pads are defined by the application of the laser direct write tool as described in the prior embodiment. The structure is then developed to cause a depression 142 in the upper surface 120 of the substrate 20 as illustrated in FIG. 14. Metal 144 is then deposited in the cavity, and the metal is planarized to produce a smooth upper surface 146 of the substrate with the embedded minimal capture pads as illustrated in FIG. 15.

A second method of producing embedded minimal capture pads commences in FIG. 16 with the application of a polymer layer 150 to the upper surface 120 of the substrate 20. A direct laser ablation tool is applied to the upper surface 120, and a portion of the material of the ceramic substrate 20 is removed to define a cavity 152 illustrated in FIG. 17. The structure is then ashed to remove carbon debris which limits good electrical contact between the metal contact pads below the polymer and a subsequently deposited thin film stud (not illustrated). Metal is then deposited and planarized resulting in the configuration illustrated in FIG. 18. Note the similarities between the FIG. 18 and the FIG. 15 configurations of the embedded minimal capture pads.

What is claimed is:

1. An apparatus comprising:

a ceramic substrate;

a ceramic via defined within said ceramic substrate at an actual location which differs from a design desired location for said ceramic via due to distortion that has occurred during the manufacture of said substrate; and a minimal capture pad which electrically communicates said actual location determined after said manufacture to said design desired location, said minimal capture pad comprising a first contact portion substantially conforming to the shape of said ceramic via in electrical contact therewith, and a second contact portion for electrically contacting a thin film stud disposed at said design desired location and substantially conforming to the shape of said thin film stud.

2. The apparatus as described in claim 1, further comprising:

electrically conducting material in said ceramic via, said material being such that when electrical signals are generated within said ceramic via, the capacitance, noise or delay of the signals are minimized.

3. The apparatus as described in claim 1, further comprising:

a thin film stud in electrical contact with second contact portion at said design desired location.

4. The apparatus as described in claim 1, further comprising:

a thin film stud in electrical contact with said actual location.

5. The apparatus as described in claim 1, wherein said minimal capture pad further comprises:

a connector portion connecting said first contact portion and said second contact portion.

6. The apparatus as described in claim 5, wherein said connector portion has a substantially uniform width and depth.

7. The apparatus as described in claim 5, wherein said connector portion has a width and depth which are the minimum size for a selected level of current transmission.

8. The apparatus as described in claim 6, wherein said first contact portion, said second contact portion, and said connector portion define a substantially dumbbell-shaped configuration.

9. The apparatus as described in claim 1, wherein said minimal capture pad is disposed on the surface of said ceramic substrate.

10. The apparatus as described in claim 1, wherein said minimal capture pad is embedded in the surface of said ceramic substrate.

11. In a ceramic substrate having vias therein with thin film studs in electrical contact therewith and at least some of such vias being disposed at locations which differ, due to distortions that have occurred during substrate manufacture, from design locations in said substrate at which said thin film studs are located, and having respective capture pad for electrically connecting said actual location to said design location, the improvement wherein said capture pad electrically connects the ceramic via location determined after substrate manufacture to said design location and comprises:

a ceramic via contact portion and a thin film stud contact portion; and a connector for electrically connecting said ceramic via contact portion and said thin film stud contact portion, said connector having a configuration and orientation that achieve the minimum size for a selected level of current transmission.

12. In a ceramic substrate as described in claim 11, wherein said ceramic via contact portion substantially conforms to the shape of its respective ceramic via.

13. In a ceramic substrate as described in claim 11, wherein said thin film stud contact portion substantially conforms to the shape of its respective thin film stud.

14. In a ceramic substrate as described in claim 11, wherein said connector has a substantially uniform width and depth.

15. In a ceramic substrate as described in claim 11, wherein said thin film stud contact portion, said ceramic via contact portion, and said connector define a substantially dumbbell-shaped configuration.

* * * * *